United States Patent [19]

Leburton et al.

[11] Patent Number: 5,021,841
[45] Date of Patent: Jun. 4, 1991

[54] SEMICONDUCTOR DEVICE WITH CONTROLLED NEGATIVE DIFFERENTIAL RESISTANCE CHARACTERISTIC

[75] Inventors: Jean-Pierre Leburton; James Kolodzey, both of Urbana, Ill.

[73] Assignee: University of Illinois, Urbana, Ill.

[21] Appl. No.: 258,294

[22] Filed: Oct. 14, 1988

[51] Int. Cl.$^5$ .......................................... H01L 29/80
[52] U.S. Cl. ...................................... 357/22; 357/16; 357/4; 357/13
[58] Field of Search ................ 357/22 A, 22 MD, 16, 357/4, 13, 22

[56] References Cited

U.S. PATENT DOCUMENTS

| | | | |
|---|---|---|---|
| 4,734,750 | 3/1988 | Okamura et al. | 357/16 |
| 4,806,998 | 2/1989 | Vinter et al. | 357/4 |
| 4,807,001 | 2/1989 | Hida | 357/22 A |

FOREIGN PATENT DOCUMENTS

| | | | |
|---|---|---|---|
| 0184827 | 6/1986 | European Pat. Off. | 357/22 A |
| 59-90978 | 5/1984 | Japan | 357/16 |
| 61-96767 | 5/1986 | Japan | 357/22 MD |
| 61-248568 | 11/1986 | Japan | 357/22 MD |
| 63-37570 | 2/1988 | Japan | 357/22 A |
| 63-47974 | 2/1988 | Japan | 357/16 |

OTHER PUBLICATIONS

Kastalsky et al., "Novel High-Speed Transistor Based on Charge Emission from a Quantum Well", 3/14/88, Appl. Physic Lett. 52.
Kastalsky et al., "Current Controlled Negative . . . Devices", 6/12/89, Appl. Phys. Lett. 54.
Kastalsky et al., "High-Frequency . . . Devices", 1/6/86, Appl. Phys. Letter 48.
Vinter et al., "Tunneling Transfer FET . . . Device", 2/16/87, Appl. Phys. Letter 50.
Leburton et al., "Tunneling Injection into Modulation Doping Structures: A Mechanism for Negative Differential Resistance Three-Terminal High Speed Devices", IEEE, vol. 35, No. 9, 9/1988.
Capasso et al., IEEE, Electron Device Lett., EDL-7, 573 (1986).
Futatsugi et al., Jpn. J. Appl. Phys., 26, L131 (1987).
Smith et al., Electron. Lett., 22, 780–781 (1986).
Hess et al., Appl. Phys. Lett., 35, 469–471 (1979).
Kastalsky et al., IEEE Electron Device Lett. EDL-4, 334–336 (1983).
Sze, Physics of Semiconductor Devices, 2nd ed., Wiley, 1981, pp. 513–539.
Kane, Basic Concepts of Tunneling in "Tunneling Phenomena in Solids", Plenum, 1969, pp. 1–11.
Ricco et al. "Physics of Resonant Tunneling", Phys. Rev. B, 29, pp. 1970–1981, 1984.
Tabatabaie et al., "Determination of Elastic Tunneling Traverse Times", IEDM Tech. Dig., Dec. 1986.
Zipperian et al., International Electron Devices Meeting, Technical Digest, Washington, DC, 1983, p. 696.
"Tunneling in Solids", Suppl. 10, Academic, NY, 1969, pp. 207–231.
Chang et al., Appl. Phys. Lett., 24, 593, 1974.
Sollner et al., Appl. Phys. Lett., 50, 332, 1987.
Taylor et al., Appl. Phys. Lett., 50, (24), Jun. 1987.
Luryi et al., Appl. Phys. Lett., 47, (12), Dec. 1985.
Rezek et al., Appl. Phys. Lett., 31, (10), Nov. 1977.
Yokoyama et al., A New Functional, Resonant Tunneling Hot Electron Transistor, Japanese Journal Appl. Phys., 1985.

*Primary Examiner*—Rolf Hille
*Assistant Examiner*—Minhloan Tran
*Attorney, Agent, or Firm*—Martin Novack

[57] ABSTRACT

The disclosed invention utilizes a homojunction tunneling mechanism of injection into the channel of a modulation doped field effect transistor. The onset of negative differential resistance can be controlled via the gate of the field effect transistor. In one embodiment there is homojunction tunneling within a bipolar field effect structure.

24 Claims, 5 Drawing Sheets

SEMICONDUCTOR DEVICE WITH CONTROLLED NEGATIVE DIFFERENTIAL RESISTANCE CHARACTERISTIC

BACKGROUND OF THE INVENTION

This invention was made with Government support under Contract N00014-86-K-0512 awarded by the Department of the Navy. The Government has certain rights in the invention.

This invention relates to improvements in semiconductor devices and their operation and, more particularly to improved obtainment and control of negative differential resistance characteristics in semiconductor devices.

The development of semiconductor devices which exhibit negative differential resistance characteristics is of great interest for various reasons, including the potential use of such devices for high power microwave generation, high speed switching, and other applications. Resonant tunneling in tunnel diodes, which can provide a two terminal device with a negative differential resistance characteristic, has been the subject of research for a number of years, and advances in fabrication techniques has produced devices which exhibit extremely high frequency responses. However, many desired functions and widespread digital and microwave applications will only be achieved with three-terminal devices, wherein the third terminal can be used for controlling device operation. Various attempts have been made to devise resonant tunneling structures wherein the onset of negative differential resistance can be controlled via a third terminal. However, three terminal negative differential resistance devices which have been made or proposed suffer various disadvantages. For example, performance of three terminal heterobarrier devices seem to be limited by the background current, thermionic emission and high-energy tunneling, which dominates and hides the negative differential resistance characteristic unless devices are operated at low temperature.

Recently, approaches using bipolar technology for room temperature operation of three terminal resonant tunneling heterostructure devices have been suggested [see, for example, F. Capasso et al., IEEE, Electron Device Lett., EDL-7, 573 (1986) or T. Futatsugi et al. Jpn. J. Appl. Phys., 26, L131 (1987)].

With regard to high speed devices, reference can also be made to high electron mobility transistors [see e.g. Smith et al., Electron. Lett., 22, 780–781 (1986)], and real space transfer structures such as the NERFET, which exhibits negative differential resistance characteristics. [See e.g. Hess et al., Appl. Phys. Lett., 35, 469–471 (1979) and Kastalsky et al., IEEE Electron Device Lett. EDL-4, 334–336 (1983)].

It is among the objects of the present invention to provide improvements in three terminal devices exhibiting negative differential resistance characteristics.

SUMMARY OF THE INVENTION

The present invention utilizes a homojunction tunneling mechanism of injection into the channel of a modulation doped field effect transistor. The onset of negative differential resistance can be controlled via the gate of the field effect transistor. In one of the embodiments hereof there is homojunction tunneling within a bipolar field effect structure.

In accordance with a 1st embodiment of the invention, there is disclosed a semiconductor device which has a first layer of relatively small bandgap semiconductor material, for example GaAs, said first layer being of a first semiconductor type, for example p-type. A second layer of the relatively small bandgap semiconductor material is formed on the first layer, the second layer being of second conductivity type that is opposite the first semiconductor type. A third layer of said relatively small bandgap semiconductor material is formed on the second layer, the third layer being substantially undoped. A fourth layer of relatively large bandgap semiconductor material, for example AlGaAs, is formed on the third layer, and a gate electrode is formed on the fourth layer. [As used herein, the term "formed on" a given layer contemplates both the situation where formation is directly on the given layer and the situation where there may be an intervening protective or isolation layer or the like, as described below with regard to device fabrication.] Source and drain regions are provided adjacent to respective opposite edges of the second, third, and fourth layers, and source and drain electrodes are respectively coupled to the source and drain regions. In a form of the first embodiment of the invention, the first layer is heavily doped p-type GaAs, the second layer is heavily doped n-type GaAs, the third layer is substantially undoped GaAs, and the fourth layer is heavily doped n-type AlGaAs. [As used herein, "heavily doped" means at least about $10^{18}$ carriers per $cm^3$, although substantially higher doping levels are used for some of the regions hereof.] In this embodiment, the source and drain regions are heavily doped n-type GaAs regions. Also in this embodiment, a pair of lightly doped n-type GaAs regions are formed beneath the respective source and drain regions and adjacent the opposing edges of the p-type GaAs layer, to avoid tunnel leakage to the source and drain regions from the underlying p-type GaAs layer.

In accordance with a further embodiment of the invention, there is disclosed a semiconductor device which has a pair of heavily doped adjacent layers of relatively small bandgap semiconductor material of opposite conductivity type. A pair of substantially undoped channel layers of the relatively small bandgap semiconductor material are respectively formed on opposing sides of the pair of heavily doped layers. A pair of layers of relatively large bandgap semiconductor material of opposite conductivity types are respectively formed on opposing sides of the pair of substantially undoped layers. Source and drain regions of the relatively small bandgap semiconductor material are provided, the source and drain regions being of opposite conductivity type. The source region is adjacent to an edge of one of the channel layers and also adjacent to an edge of the one of the heavily doped layers of relatively small bandgap material that is of like semiconductor type to the source region and also adjacent to an edge of the one of the layers of relatively large bandgap material that is of like semiconductor type to the source region. The drain region is adjacent to an edge of the other of the channel layers and also adjacent to an edge of the one of the heavily doped layers of relatively small bandgap material that is of a like semiconductor type to the drain region and also adjacent to an edge of the one of the layers of relatively large bandgap material that is of a like semiconductor type to the drain region. Means are also provided for electrically coupling to each of the source region, the drain region, and the layers of relatively large bandgap semiconductor material.

Further features and advantages of the invention will become more readily apparent from the following detailed description when taken in conjunction with the accompanying drawings.

DESCRIPTION OF THE PREFERRED EMBODIMENT

Figure 1:
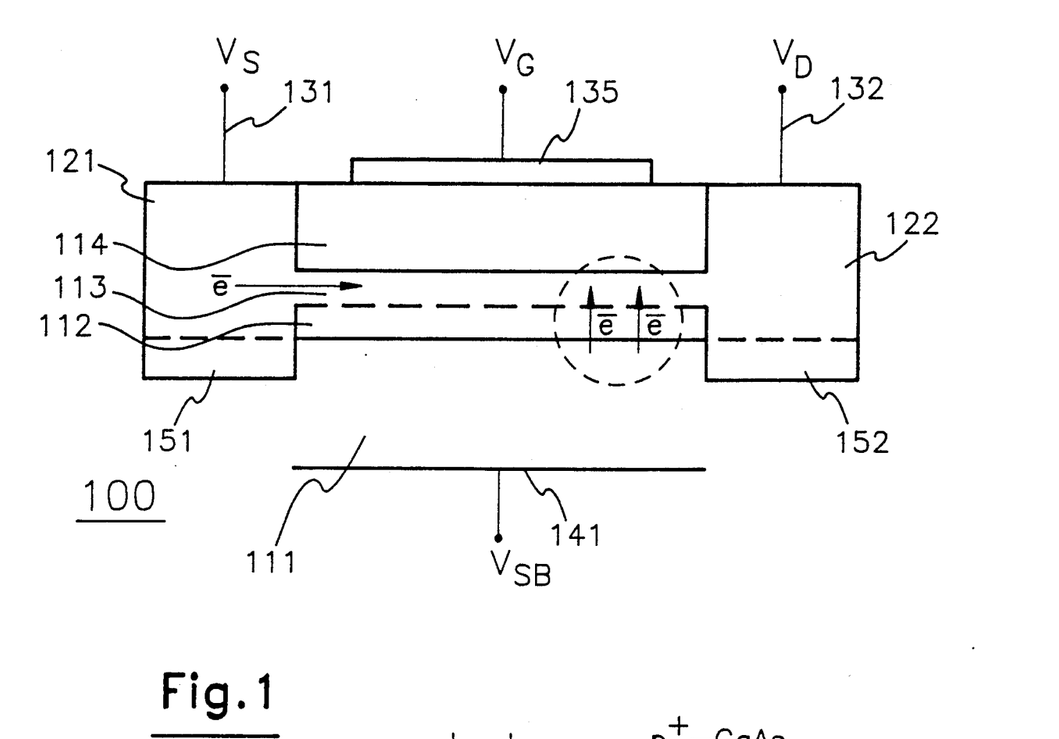
FIG. 1 is a diagram illustrating the structure of a semiconductor device in accordance with a first embodiment of the invention.

Referring to FIG. 1, there is shown a device 100 in accordance with a first embodiment of the invention. The device can be viewed as conventional type of modulation doped field effect transistor which has been combined with a tunnel homojunction injection device. A thin heavily doped n+ layer 112 of GaAs is intercalated between a heavily doped p+ GaAs substrate 111 and the undoped GaAs layer 113 of a modulation doped field effect structure which includes a heavily doped n+ AlGaAs layer 114 above the undoped GaAs layer, a heavily doped n+ GaAs source region 121 that is adjacent one edge of layers 112, 113, and 114, and a heavily doped n+ GaAs drain region 122 that is adjacent the other edge of layers 112, 113, 114. A metallic gate electrode 135 is formed on layer 114 and source electrode 131 and drain electrode 132 and substrate contact 141 are respectively connected to source region 121, drain region 122, and substrate 111.

In the FIG. 1 illustration, consider the example of the drain 132 at a positive potential ($V_D$ positive) and the source 131 and substrate 111 at ground reference potential ($V_s$ at ground and $V_{SB}$ at ground). The (u,n+)-p+ junction (layers 113, 112, 111), where u means undoped operates as a backward diode that injects electrons from the substrate ($V_{SB}$ contact) into the two dimensional (2D) channel layer 113. Under equilibrium conditions, the n+-layer 112 is entirely depleted and forms the junction space charge layer. The undoped channel layer 113 contains the 2D electron gas. Negative differential resistance (NDR) effects are controlled by the potential applied to the gate electrode 135, as described further hereinbelow.

An additional advantage of a tunnel homojunction in the structure hereof is that the p+ substrate 111 forms an isolating reverse-biased p-n junction at the source and drain, thereby confining the injection within the active channel region of the modulation doped structure. To avoid tunnel leakage from the p+ region to source or drain regions, pre-implanted lightly doped n regions, shown in FIG. 1 as regions 151 and 152, may be used.

Figure 2:
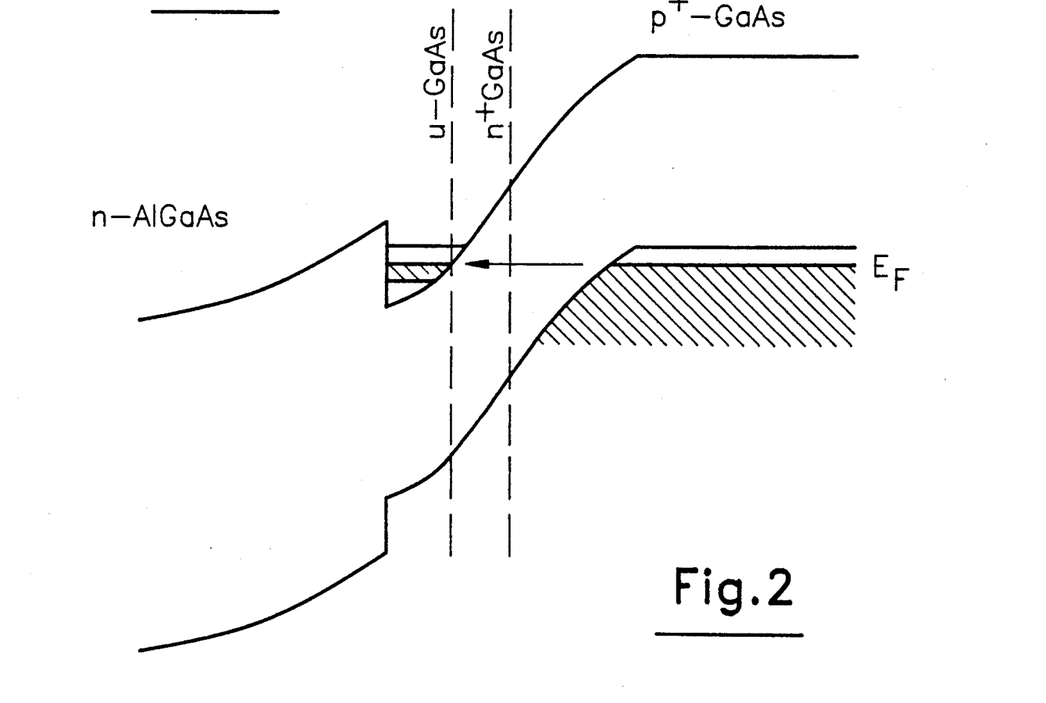
FIG. 2 is a band diagram of the device of the FIG. 1 embodiment.

In its normal mode, the device of FIG. 1 operates like a modulation doped field effect transistor i.e., with the source and the substrate grounded, and the drain positively biased. However, owing to the positive voltage distribution in the channel, the tunnel junction is nonuniformly reverse biased and injects electrons into the channel, mostly on the drain side (FIG. 2). Assume the following two conditions: 1) the tunnel current is directly injected into the channel 113 without leaking into the source and drain electrodes and 2) the entire channel is in pre-saturation regime (no pinch off). In this condition, the gate field retains control of the channel charge under moderate drain bias, which makes the gradual channel approximation (G.C.A.) valid from source to drain [see S. M. Sze, Physics of Semiconductor Devices, 2nd ed., Wiley, 1981, pp. 513-539]. With the source-drain axis being the x direction, the channel current $I_c$ between two points x and x+dx infinitesimally close is given by $$I_c(x + dx) = I_t(x)\,dx + I_c(x) \tag{1a}$$

or $$dI_c(x) = I_t(x)\,dx. \tag{1b}$$

The integration of the latter relation gives $$I_D{}^t = I_c(L) = \int_0^L I_t(x)\,dx + I_s{}^t \tag{2}$$

where $I_s{}^t$ and $I_D{}^t$ are the source and drain currents in the presence of tunneling $I_t$, respectively, and L is the channel length. The double integration of (1b) yields $$\int_0^x I_c(x)\,dx = \int_0^x dx' \int_0^{x'} I_t(x'')\,dx'' + I_s{}^t x \tag{3a}$$

which, using the G.C.A. for $I_c(x) = ZC\mu(V_{GT} - V)dV/dx$ dividing by L and evaluation at x=L results in the useful equation $$\frac{\mu CZ}{L}\left(V_{GT}V_{DS} - \frac{V_{DS}^2}{2}\right) = \int_0^L dx/L \int_0^x I_t(x')\,dx' + I_s{}^t. \tag{3b}$$

Here, Z is the gate width, C is the gate capacitance (per unit area), and $\mu$ is the electron mobility. $V_{DS}$ is the source-drain voltage and $V_{GT}$ is the effective gate-source bias. The left-hand side of this relation is the expression of the drain-source current $I_{DS}{}^0$ in the absence of tunneling. The tunnel current density under reverse-bias can be approximated by the simple relation $$I_t = ZJ_0[(exp(V/V_t)) - 1] \tag{4}$$

[see the Sze reference, supra] where the effect of channel quantization has been neglected in a first approximation. V is the channel-substrate bias, and $J_0$ and $V_t$ are two constants characteristic of the junction and the tunnel process. The second term on the righthand side of (4) accounts for zero bias conditions. Due to its exponential dependence on $V_{DS}$ through V(x), the $I_t$ term in (3b) will increase faster with voltage than the power law $I_{DS}{}^0$ term. Therefore, as $V_{DS}$ and V(x) increase the source current $I_s{}^t$ versus $V_{DS}$ will exhibit an NDR as a result of the combined action of carrier injection into the channel and the control of the total channel charge by the gate field. In some sense, this effect is the inverse-analog of real space transfer [see Hess et al., Negative Differential Resistance through Real Space Electron Transfer, Appl. Phys. Lett., 35, pp. 469-471, 1979] since the latter coincides with carrier ejection from the channel due to high-energy scattering. The tunnel junction capacitance has not been included in this analysis because it does not affect the injection mechanism and consequently does not qualitatively change the conclusions.

Figure 3:
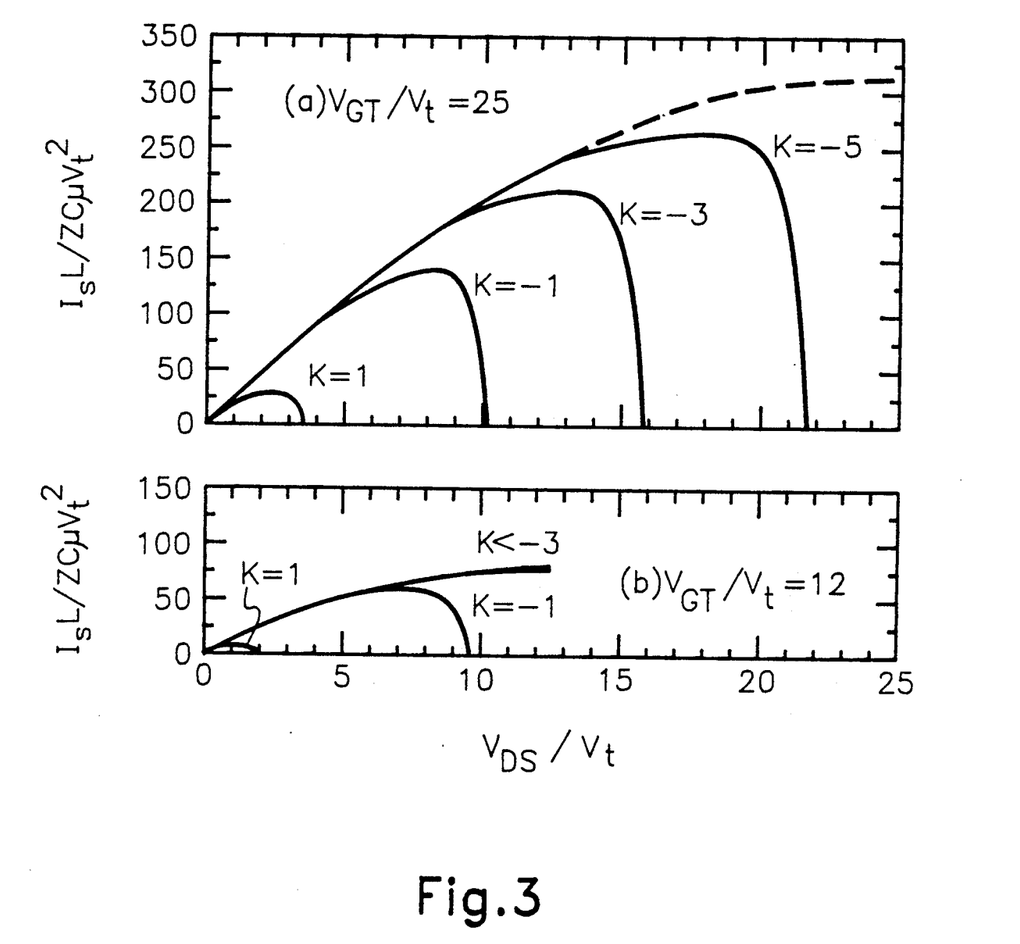
FIG. 3 illustrates computed I-V characteristics of the source current for various injection conditions for the device of the FIG. 1 embodiment.

FIG. 3 shows a calculation of the source current as a function of the drain voltage for different values of the tunnel current constant $J_0$. For the sake of simplicity it is assumed that the exponential in the double integral of (3b) is equal to its maximum value. Current and voltages have been normalized for the sake of simplicity. $V_t$ depends on the junction design, but a typical value of 50 mV is reasonable, and yields realistic values of the gate bias $V_{GT}=0.6$ and 1.25 V in the two cases investigated here. At high gate bias, noticeable NDR in the source current occurs in the presaturation regime of the transistor for a wide range of saturation values $J_0$ (FIG. 2(a)). The smaller the $J_0$, the steeper the NDR and the higher the peak current which yields a large peak-to-valley ratio in the I-V characteristics. Therefore, optimum NDR conditions do not require thin excessively doped tunnel junctions since the saturation current $J_0$ need not be extremely high. This makes the realization of the device feasible with conventional technology. On the other hand, at low gate bias, the occurrence of NDR features critically depends on the tunnel saturated current (FIG. 2(b)). With small $J_0$, the tunnel injection is too weak to substantially influence the source current before the onset of normal current saturation in the channel. With large $J_0$, tunneling dominates and the FET action is lost; the source current ceases to be controlled by the gate field.

Consequently, for a particular junction design with given $J_0$ value, the gate bias can then be used to turn the NDR on or off by controlling the source current injection. The device operates as a switch for the NDR.

The speed performance of the FIG. 1 device is essentially determined by the time constants associated with the tunneling time and the channel charging time. The former is a function of the level broadening $\Delta E$ resulting from the interaction between electronic states across the junction [see, for example, E. O. Kane, Basic Concepts of Tunneling in "Tunneling Phenomena in Solids", Plenum, 1969, pp. 1-11; B. Ricco et al. "Physics of Resonant Tunneling", Rev. B, 29, pp. 1970-1981, 1984; N. Tabatabaie et al., "Determination of Elastic Tunneling Traverse Times", IEDM Tech. Dig., Dec., 1986], i.e.

$$\tau_{tun} = \pi \hbar / \Delta E \tag{5}$$

In heavily doped junctions ($N_D \sim 10^{19}/cm^3$) of small-gap materials such as InGaAs ($E_G \sim 0.75 eV$), the maximum electric field $F_{max}$ exceeds $10^6$ V/cm. In strong reverse bias, the tunneling distance can decrease below 50 Angstroms, which is comparable to the barrier width used in heterojunction resonant tunneling. The typical energy level broadening resulting from the interaction between electronic states across the potential barrier is of the order of 1 meV [see Tabatabaie et al., supra] so that $\tau_{tun}$ can be as low as 2 ps. The channel charging time is given by the carrier transit time, which is actually limited by the saturation velocity $V_{sat}$, i.e.

$$\tau = L/V_{sat} \sim 1 ps. \tag{6}$$

Therefore, for a quarter-micrometer gate length, the resulting limiting time that determines the speed of the FIG. 1 device is of the order of a few picoseconds and promises operation in the 100 GHz range.

The device of the FIG. 1 embodiment can be fabricated using known techniques. An example of a device is made using molecular beam epitaxy (MBE) for semiconductor crystal growth. The following layers are successively grown by MBE on a semi-insulating GaAs substrate: 1 micron GaAs:Be($p=2\times10^{18}$ $cm^{-3}$)[layer 111], 100 Angstroms GaAs:Si($n=2\times10^{18}cm^{-3}$)[layer 112], 100 Angstroms GaAs (undoped)[layer 113], 50 Angstroms Al$_{0.3}$Ga$_{0.7}$As (undoped spacer layer), 350 Angstroms Al$_{0.3}$Ga$_{0.7}$As:Si($n=2\times10^{18}cm^{-3}$)[layer 114], 50 Angstroms GaAs:Si($n=2\times10^{18}cm^{-3}$—protective layer). The source and drain regions are formed by alloying or diffusion. Mesas are formed in the wafer for device isolation. The n$^-$ regions 151 and 152 can be formed by preimplantation, or can be tails of the source and drain diffusions. Evaporative metal application is then used to form the gate and the source, drain, and substrate contacts.

Other systems of relatively low and relatively high bandgap semiconductor materials can be utilized in the described device, for example InGaAs as the relatively low bandgap material and InP, InAlAs or AlGaAs (pseudomorphic) as the relatively high bandgap material.

Figure 4:
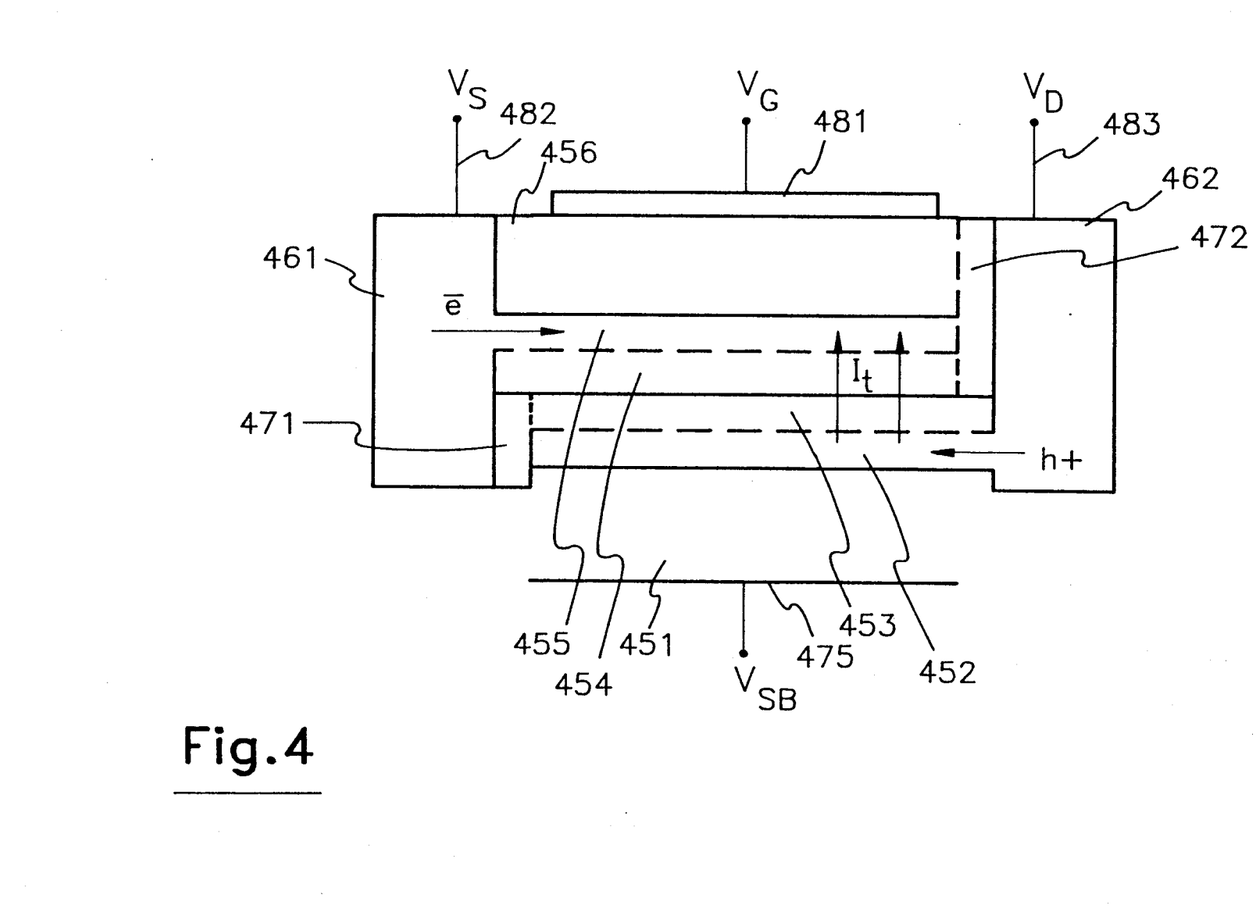
FIG. 4 is a diagram illustrating the structure of a device in accordance with a second embodiment of the invention.

Referring to FIG. 4, there is shown a device 400 in accordance with a further embodiment of the invention. As in the FIG. 1 embodiment, this device combines a modulation doped structure with a tunnel homojunction for operation as a negative differential resistance device with gate control. In the FIG. 4 embodiment both electrons and holes are involved in the conduction mechanism of the p-n junction, so the tunnel field-effect transistor is bipolar. A pair of GaAs layers 453 and 454 are heavily doped and of opposite conductivity types, the layer 453 being p$^+$ and the layer 454 being n$^+$. A pair of undoped GaAs channel layers 455 and 452 are formed on opposite sides of the heavily doped layers 453, 454. A pair of lightly doped layers 451 and 456 of AlGaAs are formed on opposing sides of the pair of undoped layers 452, 455. The layer 451 is p$^-$ and the layer 456 is n$^-$. A highly doped GaAs source region 461 (n$^+$) is adjacent an edge of the layers 454, 455, and 456, and a highly doped GaAs drain region 462 (p$^+$) is adjacent an edge of the layers 453, 452 and 451. A metallic gate electrode 481 is formed on layer 456, and source electrode 482, drain electrode 483, and contact electrode 475 are respectively coupled to source region 461, drain region 462, and layer 451. The device would be fabricated, for example, using molecular beam epitaxy and the type of procedure described above. In the present embodiment the channel layers 452 and 455 are quantum well layers, for example 75-100 Angstroms thick, and the layers 453 and 454 are very heavily doped (e.g. $10^{19}$ cm$^{-3}$ or greater) and each has a thickness of 50-75 Angstroms.

As in the previous embodiment, other systems of relatively low and relatively high bandgap semiconductor materials can be utilized in the described device, for example InGaAs as the relatively low bandgap material and InP, InAlAs or AlGaAs (pseudomorphic) as the relatively high bandgap material. The lightly doped vertical n⁻ and p⁻ isolation regions 471 and 472, respectively, can be obtained by grading of the implantation profile or as part of the source and drain diffusion processes.

Figure 5:
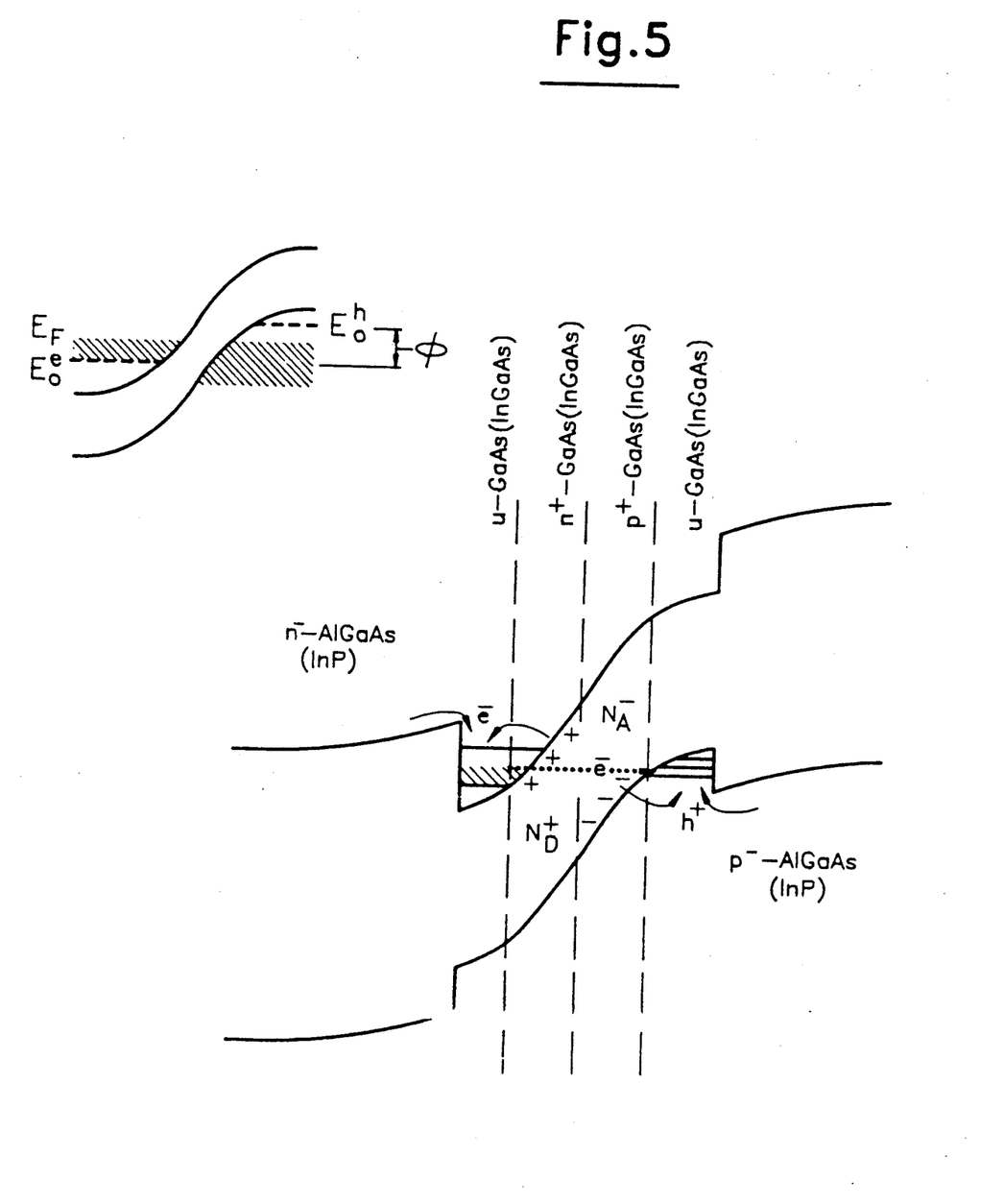
FIG. 5 is a band diagram of the device of the FIG. 4 embodiment.

At equilibrium the two heavily doped layers (453, 454) are totally depleted by forming the space-charge region of the junction, but also by backward diffusion of carriers toward the undoped layers 452 and 455. The latter mechanism substantially increases the channel concentration with respect to the conventional value resulting from the modulation doping mechanism. With this extra modulation doping mechanism, the two (electron and hole) channels are highly conducting and form extended lateral 2D electrodes for the tunnel junction. The drain and source regions 461 and 462 connect with the channels of identical conductivity types while forming a blocking contact for opposite-type carriers. The lightly doped vertical n⁻ and p⁻ layers 471 and 472 improve the isolation of each channel from the unlike electrode and prevent leakage currents at these junctions. Under forward bias, the current flows from the selective contacts (461, 462) to the channels (455, 452) with low resistance. Owing to the high carrier concentration in the two channels, electrons tunnel through the junction at low bias voltages by a process similar to the tunnel mechanism leading to the NDR in conventional tunnel diodes. An important feature of the device configuration is the 2D nature of the quantum tunneling with step-function initial and final carrier density of states. This causes abrupt changes in the tunnel current when 2D electron and hole levels cease to overlay [FIG. 5]. Consequently, the device will exhibit multiple NDR's with arbitrarily small resistance values. In practice, the latter is determined by the peak current density flowing through the junction [see Eq (9) below]. With this device configuration, a gate-substrate reverse bias may be used to enhance the current by increasing the separation $\phi$ between the electron and hole ground levels, $\phi = E_o^h - E_o^e$, since there is more overlap between electron and hole energies for tunneling across the junction. This situation is new and unique because in conventional two-terminal tunnel junctions the characteristics are determined by the level and profile of the doping which are process dependent and consequently inalterable during device operation. Light doping in the large-gap materials reduces the space-charge field in the regions adjacent to the p⁻ n junction and prevents FowlerNordheim tunneling across the heterojunctions. There is thus advantage in using heterojunctions with large bandgap offsets such as the new pseudomorphic AlGaAs/InGaAs structures recently proposed to enhance the channel carrier density. [See T. E. Zipperian et al., International Electron Devices Meeting, Technical Digest, Washington, D.C. 1983, p. 696].

Figure 6:
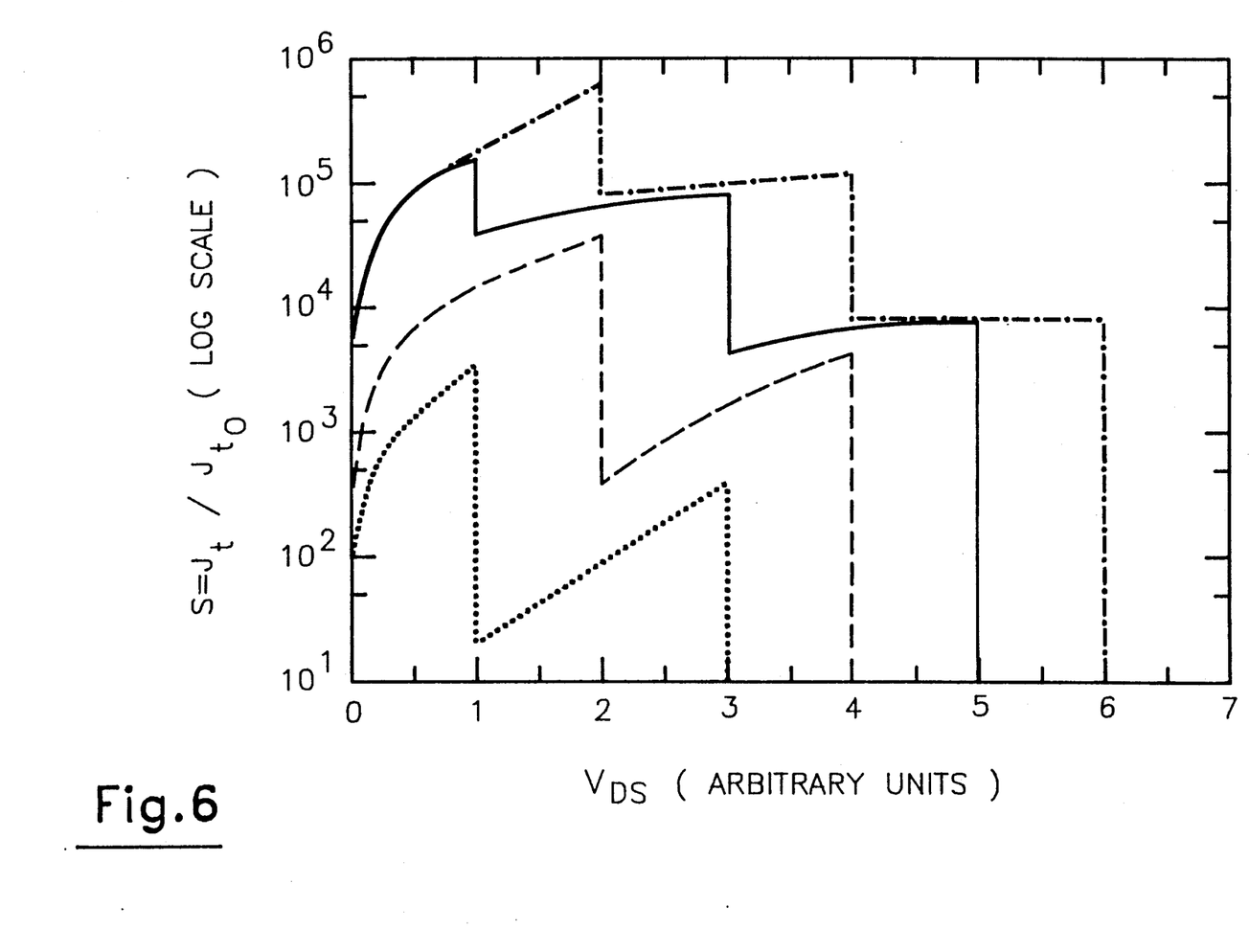
FIG. 6 is a diagram of normalized current versus voltage characteristics for the device of the FIG. 4 embodiment.

FIG. 6 shows a calculation of the tunnel current as a function of the drain voltage for different values of $\phi$. A 2D transfer Hamiltonian method [see "Tunneling In Solids", Suppl. 10, Academic, N.Y. 1969, p. 207] has been used to compute the tunnel current and reproduces the essential features of Zener tunneling. For the sake of simplicity, the 2D junction has been assumed to be symmetrical with parabolic confining potential in the channel. This is in contrast with quasitriangular potentials in FET channels, but is justified by the strong carrier concentration combined with low surface fields resulting from low modulation doping in AlGaAs. $J_{to}$ is a constant which depends on the characteristics of the junction. The main features here are the multiple abrupt NDR transitions which occur when 2D electron and hole tunneling states cease to overlap. Similar abrupt transitions have been obtained by Tabatabaie et al. (supra). Calculations show that because of channel conductivity, the tunnel current is a sensitive function of $V_{DS}$ and $\phi$, and varies by several orders of magnitude with voltage. This results in large peak-to-valley ratios which decrease with $\phi$.

The speed performances of the FIG. 4 embodiment are determined by the time constants associated with various processes controlling the transport in the structure. [See Chang et al., Appl. Phys. Lett., 24, 593, 1974; and Sollner et al., Appl. Phys. Lett., 50, 332, 1987]. It is well known that the tunneling time is essentially a function of the level broadening $\Delta E$ resulting from the interaction between electronic states across the junction, i.e., as first set forth above in (5).

$$\tau_{tun} \pi \hbar / \Delta E \tag{7}$$

In strong junction fields and low-gap materials such as InGaAs, $\Delta E$ resulting from the overlap of electron and hole wave functions can reach 2–3 meV so that $\tau_{tun}$ is about 1–0.5 ps. However, the charging time of each 2D layer is also of importance and can introduce some limitations in the device high-frequency operation. For 2D degenerate channels and a quarter micron source-drain spacing, layer specific resistances ($R_l$ times device width) as low as $10^{-2}$ ohm-cm can be achieved at room temperature and the mobility difference between electrons and holes can be offset by doping the p layer more heavily than the n layer in the tunnel junction. High P doping is fortunately possible with beryllium in GaAs. Among the various capacitances associated with the tunnel structure, the junction capacitance $C_j$ is certainly the most critical for this time constant. With a distance d = 150 Angstroms between the two heterojunctions, $C_j$ is about 17 pF/cm; the gate capacitance $C_G$ is three times less with a top AlGaAs epilayer of 500 Angstroms, so that the total charging time is below 1 ps.

At constant reverse gate bias, the 2D junction can be driven into the NDR regime by applying the appropriate source-drain voltage and operating essentially as a 2D tunnel diode. The cutoff frequency is given by $$f_{co} = (2\pi R_{NDR} C_j)^{-1} \sqrt{R_{NDR}/R_s - 1}, \tag{8}$$

where $R_{NDR}$ is the NDR value and $R_s$ is the series resistance of the junction. Owing to the 2D level broadening $\Delta E$, $R_{NDR}$ is not infinitely small, but of the order of $$R_{NDR} \sim E/q\Delta J_{pv}A, \tag{9}$$

where $\Delta J_{pv}$ is the peak-to-valley current density difference and A is the junction area. Optimum values of $\Delta J_{pv} \gtrsim 10^3$ A/cm² can be achieved with use of low-gap materials (e.g., InGaAs) for the junction and external control of the tunneling injection by the gate field through the channel density. This latter advantage is a unique feature of the three terminal device where the control of the input current is separated from the tunnel characteristics. With a gate width of 100 μm, it is estimated that $R_{NDR} \sim 8$ ohms. $R_s$ has contribution from contacts and spreading resistance, and is typically 0.7 ohms, but can be reduced to half this value. Therefore, we obtain $f_{co} \sim 300\text{--}500$ GHz Because of the predicted high magnitude of the NDR peak-to-valley ratio, the FIG. 4 device can also operate as a switch between high current level (pre-NDR transition, ON state) and low current level (post-NDR transition, OFF state). In this mode, the source-drain voltage is biased in the NDR region, and the gate voltage switches the device between ON and OFF states. Owing to the 2D nature of the tunneling states, only tiny variations of the gate voltage are required to shift the quantized levels with respect to one another during tunneling and give rise to the NDR. This results in large current gain and extremely fast switching. The current response time is given by $$\tau_{resp} = C_G / g_m(V_{NDR}),  \quad (10)$$

where $g_m(V_{NDR})$ is the transconductance at $V_{DS} = V_{NDR}$ which for this process is controlled by the current in the n channel. $\tau_{resp}$ is obtained from the cutoff frequency at which the input gate current equals the output drain current. This represents a condition of unity incremental current gain. One can write $$g_m(V_{NDR}) = \frac{dI_{DS}(V_{NDR})}{dV_G} = \frac{dI_{DS}}{d\phi} \frac{d\phi}{dV_G}.  \quad (11)$$

For a current variation corresponding to $\Delta J_{pv}$, the first term is equal to $1/qR_{NDR}$, since $d\phi = dV_{DS}$ in the limit of vanishing series resistance. On the other hand, $\Delta\phi = -\Delta E_o^3$, if $E_o^h$ is kept constant. By assuming that under strong degeneracy most of the electrons are in the lowest level, the expression of the 2D density of status yields $$E_f - E_o^e = \pi\hbar^2 n_s / m^*,  \quad (12)$$

where $E_f$ is the Fermi level and $n_s$ is the 2D electron density, and $m^*$ is the electron effective mass. Combining all these equations, one obtains $$g_m(V_{NDR}) = \frac{\pi\hbar^2}{qm^* R_{NDR}} \frac{dn_s}{dV_G} = \frac{\pi\hbar^2}{q^2 m^* R_{NDR}} \frac{C_G}{A},  \quad (13)$$

with $C_G/A = q \, dn_s/dV_G$ and $q^2 m^*/\pi\hbar^2$ is an elementary unit of 2D layer capacitance. Using Eqs. (7) and (9), the final expression for the current response time is given by $$\tau_{resp} = \frac{qm^*}{\hbar \tau_{tun} \Delta J_{pv}} \text{ or } \tau_{resp} \tau_{tun} = \frac{qm^*}{\hbar \Delta J_{pv}} < 10^{-23} \, s,  \quad (14)$$

for $m^* = 0.05 m_o$ in InGaAs junctions, where $m_o$ is the free electron mass. Ultimately, the current response time is determined by the magnitude of the tunneling injection, which causes large values of $\Delta J_{pv}$ as shown in FIG. 6. Extremely short time is expected if $\Delta J_{pv}$ exceeds $10^3$ A/cm$^2$ and would correspond to unusual large tansconductance $[g_m(V_{NDR}) \sim 10^3 mS/mm]$ at the NDR transition. This is due to the slight $V_G$ variation which is required to move the relative position of the n and p tunneling states, thereby causing large current variation without the need to redistribute the channel charge.

What is claimed is:

1. A semiconductor device, comprising:

a first layer of relatively small bandgap semiconductor material, said first layer being of a first semiconductor type;

a second layer of said relatively small bandgap semiconductor material formed on said first layer, said second layer being of a second semiconductor type that is opposite said first semiconductor type;

a third layer of said relatively small bandgap semiconductor material formed on said second layer, said third layer being substantially undoped;

a fourth layer of relatively large bandgap semiconductor material of said second semiconductor type formed on said third layer;

a gate electrode formed on said fourth layer source and drain regions of said second semiconductor type adjacent to respective opposite edges of said second, third and fourth layers; and source and drain electrodes respectively coupled to said source and drain regions.

2. The device as defined by claim 1, further comprising means for applying a positive potential to said drain electrode with respect to said source electrode and said first layer so as to cause tunnel injection into said third layer, and means for applying a signal to said gate electrode to control charge in said third layer.

3. The device as defined by claim 1, further comprising contact electrode coupled to said first layer.

4. The device as defined by claim 1, wherein said first, second, and fourth layers and said source and drain regions are heavily doped.

5. The device as defined by claim 4, further comprising a pair of regions of the same semiconductor material and type as said source and drain regions, said pair of regions being relatively lightly doped as compared to the respective source and drain regions, said pair of relatively lightly doped regions being respectively beneath said source and drain regions and adjacent opposite edges of said first layer.

6. The device as defined by claim 5, wherein said relatively small bandgap material is gallium arsenide, and said relatively large bandgap material is aluminum gallium arsenide.

7. The device as defined by claim 5, wherein said relatively small bandgap material is indium gallium arsenide and said relatively large bandgap material is selected from the group consisting of indium phosphide, indium aluminum arsenide and aluminum gallium arsenide.

8. The device as defined by claim 1, wherein said first layer is heavily doped p-type, said second and fourth layers are heavily doped n-type and said source and drain regions are heavily doped n-type.

9. The device as defined by claim 8, wherein said relatively small bandgap material is gallium arsenide, and said relatively large bandgap material is aluminum gallium arsenide.

10. The device as defined by claim 8, wherein said relatively small bandgap material is indium gallium arsenide and said relatively large bandgap material is selected from the group consisting of indium phosphide, indium aluminum arsenide and aluminum gallium arsenide.

11. The device as defined by claim 1, wherein said relatively small bandgap material is gallium arsenide, and said relatively large bandgap material is aluminum gallium arsenide.

12. The device is defined by claim 1, wherein said relatively small bandgap material is indium gallium arsenide and said relatively large bandgap material is selected from the group consisting of indium phosphide, indium aluminum arsenide and aluminum gallium arsenide. arsenide and aluminum gallium arsenide., 13. A semiconductor device, comprising:
a pair of heavily doped adjacent layers of relatively small bandgap semiconductor material of opposite conductivity type;
a pair of substantially undoped channel layers of said relatively small bandgap semiconductor material, respectively formed on opposing sides of said pair of heavily doped layers;
a pair of layers of relatively large bandgap semiconductor material of opposite conductivity types respectively formed on opposing sides of said pair of substantially undoped layers;
source and drain regions of said relatively small bandgap semiconductor material, said source and drain regions being of opposite conductivity type, said source region being adjacent to an edge of one of said channel layers and also adjacent to an edge of the one of said heavily doped layers of relatively small bandgap material that is of like semiconductor type to said source region and also adjacent to an edge of the one of said layers of relatively large bandgap material that is of like semiconductor type to said source region, said drain region being adjacent to an edge of the other of said channel layers and also adjacent to an edge of the one of said pair of heavily doped layers of relatively small bandgap material that is of a like semiconductor type to said drain region and also adjacent to an edge of the one of said layers of relatively large bandgap material that is of a like semiconductor type to said drain region; and
means for electrically coupling to each of said source region, said drain region, and said layers of relatively large bandgap semiconductor material.

14. The device as defined by claim 13, wherein said means for electrically coupling to one of said relatively large bandgap layers is a gate electrode, and said means for electrically coupling to the other of said relatively large bandgap layers is a contact electrode.

15. The device as defined by claim 13, wherein said source and drain regions are heavily doped.

16. The device as defined by claim 15, further comprising a first guard region of said relatively small bandgap material adjacent said source region and of the same conductivity type as said source region and relatively lightly doped with respect to said source region, said first guard region being disposed between said source region and the channel layer and heavily doped layer that are adjacent to the drain region, and a second guard region of said relatively small bandgap material adjacent said drain region and of the same conductivity type as said drain region and relatively lightly doped with respect to said drain region, said second guard region being disposed between said drain region and the channel layer and heavily doped layer that are adjacent to the source region.

17. The device as defined by claim 13, wherein said channel layers are quantum well layers.

18. The device as defined by claim 17, wherein said heavily doped adjacent layers of relatively small bandgap material has a thickness of less than 100 Angstroms.

19. The device as defined by claim 13, wherein said relatively small bandgap material is gallium arsenide, and said relatively large bandgap material is aluminum gallium arsenide.

20. The device as defined by claim 13, wherein said relatively small bandgap material is indium gallium arsenide and said relatively large bandgap material is selected from the group consisting of indium phosphide, indium aluminum arsenide, and aluminum gallium arsenide.

21. A semiconductor device for producing and controlling a negative differential resistance characteristic, comprising;
a semiconductor field-effect device having spaced apart source and drain regions of relatively small bandgap semiconductor material of a first semiconductor type, a pair of adjacent layers between said source and drain regions, one of said adjacent layers being a substantially undoped semiconductor channel layer of said relatively small bandgap material and the other of said adjacent layers being a relatively large bandgap semiconductor material of said first semiconductor type, and a gate electrode formed on said layer of relatively large bandgap semiconductor material;
a tunnel homojunction device including first and second layers of said relatively small bandgap semiconductor material of opposite semiconductor types, said first layer being of said first semiconductor type and being adjacent said channel layer;
means for applying a potential to said drain region with respect to said source region and said second layer to cause tunnel injection of carriers into said channel layer; and
means applying a signal to said gate electrode to control carriers in said channel layer.

22. The device as defined by claim 21, wherein said first and second layers are heavily doped.

23. The device as defined by claim 21, wherein said relatively small bandgap material is gallium arsenide, and said relatively large bandgap material is aluminum gallium arsenide.

24. The device as defined by claim 21, wherein said relatively small bandgap material is indium gallium arsenide and said relatively large bandgap material is selected from the group consisting of indium phosphide and indium aluminum arsenide, and aluminum gallium arsenide.

* * * * *